United States Patent
Too et al.

(10) Patent No.: US 7,513,035 B2
(45) Date of Patent: Apr. 7, 2009

(54) METHOD OF INTEGRATED CIRCUIT PACKAGING

(75) Inventors: Seah Sun Too, San Jose, CA (US);
Mohammad Khan, San Jose, CA (US);
James Hayward, Santa Clara, CA (US);
Jacquana Diep, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 112 days.

(21) Appl. No.: 11/422,807

(22) Filed: Jun. 7, 2006

(65) Prior Publication Data
US 2007/0284144 A1 Dec. 13, 2007

(51) Int. Cl.
*H05K 3/30* (2006.01)
*H05K 3/34* (2006.01)

(52) U.S. Cl. ............................. 29/832; 29/825; 29/833; 29/840; 438/121

(58) Field of Classification Search ............... 29/825, 29/832, 833, 840; 438/121
See application file for complete search history.

(56) References Cited

U.S. PATENT DOCUMENTS

| | | | | |
|---|---|---|---|---|
| 4,034,469 A | * | 7/1977 | Koopman et al. | 29/825 |
| 4,069,498 A | * | 1/1978 | Joshi | 257/713 |
| 4,081,825 A | * | 3/1978 | Koopman et al. | 257/713 |
| 5,455,457 A | * | 10/1995 | Kurokawa | 257/712 |
| 5,545,473 A | | 8/1996 | Ameen et al. | |
| 5,627,406 A | * | 5/1997 | Pace | 257/700 |
| 5,647,123 A | | 7/1997 | Greenwood et al. | |
| 5,793,105 A | * | 8/1998 | Pace | 257/700 |
| 5,881,945 A | * | 3/1999 | Edwards et al. | 228/124.6 |
| 5,904,499 A | * | 5/1999 | Pace | 438/108 |
| 6,165,820 A | * | 12/2000 | Pace | 438/125 |
| 6,342,407 B1 | * | 1/2002 | Goldmann et al. | 438/124 |
| 6,459,160 B1 | * | 10/2002 | Goldmann et al. | 257/778 |
| 6,504,242 B1 | * | 1/2003 | Deppisch et al. | 257/707 |
| 6,504,723 B1 | | 1/2003 | Fitzgerald et al. | |
| 6,613,605 B2 | * | 9/2003 | Pace | 438/106 |
| 6,614,110 B1 | * | 9/2003 | Pace | 257/737 |
| 6,748,350 B2 | | 6/2004 | Rumer et al. | |
| 6,848,172 B2 | | 2/2005 | Fitzgerald et al. | |
| 6,848,610 B2 | | 2/2005 | Liu | |
| 6,867,978 B2 | | 3/2005 | Whittenburg et al. | |
| 6,870,258 B1 | | 3/2005 | Too | |
| 6,882,535 B2 | | 4/2005 | Labanok et al. | |
| 6,924,170 B2 | | 8/2005 | Ravi et al. | |
| 6,934,154 B2 | | 8/2005 | Prasher et al. | |

(Continued)

FOREIGN PATENT DOCUMENTS

EP 0338249 10/1989

(Continued)

*Primary Examiner*—C. J Arbes
(74) *Attorney, Agent, or Firm*—Timothy M. Honeycutt (57) ABSTRACT

Various integrated circuit package elements are provided. In one aspect, an integrated circuit package device is provided that includes a lid for covering an integrated circuit. The lid has a convex surface for applying pressure on the integrated circuit when the lid is placed in a selected position. In another aspect, an integrated circuit package device is provided that includes a lid that has a surface for applying pressure to an integrated circuit when the lid is in a selected position. A gold film is coupled to the surface. The gold film has a periphery and a plurality of rounds extending from the periphery.

16 Claims, 7 Drawing Sheets

U.S. PATENT DOCUMENTS

| | | |
|---|---|---|
| 6,936,501 B1 | 8/2005 | Too et al. |
| 6,987,317 B2 | 1/2006 | Pike |
| 6,989,586 B2 | 1/2006 | Agraharam et al. |
| 7,009,289 B2 | 3/2006 | Hu et al. |
| 7,012,011 B2 | 3/2006 | Chrysler et al. |
| 7,014,093 B2 | 3/2006 | Houle et al. |
| 7,015,073 B2 | 3/2006 | Houle et al. |
| 7,132,356 B1 * | 11/2006 | Pace ............ 438/612 |
| 7,271,028 B1 * | 9/2007 | Pace ............ 438/107 |
| 2002/0090761 A1 * | 7/2002 | Goldmann et al. ........ 438/124 |
| 2003/0058620 A1 * | 3/2003 | Rumer et al. ............ 361/705 |
| 2004/0178494 A1 | 9/2004 | Lin et al. |
| 2005/0133934 A1 * | 6/2005 | Melody et al. ........... 257/779 |
| 2005/0255635 A1 | 11/2005 | Starkston |
| 2007/0164424 A1 * | 7/2007 | Dean et al. ............ 257/707 |

FOREIGN PATENT DOCUMENTS

| | | |
|---|---|---|
| JP | 2003124438 | 4/2003 |

* cited by examiner

METHOD OF INTEGRATED CIRCUIT PACKAGING

BACKGROUND OF THE INVENTION

1. Field of the Invention

This invention relates generally to semiconductor processing, and more particularly to methods of and apparatus for packaging an integrated circuit.

2. Description of the Related Art

Many current integrated circuits are formed as multiple die on a common wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. After the die is mounted to the substrate, a lid is attached to the substrate to cover the die. Some conventional integrated circuits, such as microprocessors, generate sizeable quantities of heat that must be ferried away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material ideally fully contacts both the upper surface of the integrated circuit and the portion of the lower surface of the lid that overlies the integrated circuit. Conventional thermal interface materials include various types of pastes, and in some cases, a metal. More recently, designers have begun to turn to indium as a thermal interface material.

The attachment of a lid to a die substrate involves a complex choreography of steps. The thermal interface material must be applied to the die. An adhesive must be applied to the substrate and cured in such a way that does not produce unwanted irregularities in the thickness or wetting of the thermal interface material. The lid must be attached to the substrate so that the tilt of the lid relative to the die is within acceptable tolerances. High tilt can lead to nonuniformities in thermal interface material thickness, which can produce poor heat transfer characteristics.

Indium as a thermal interface material presents certain challenges. A consistent metallurgical bond between the integrated circuit and the indium, and in turn, between the indium and the package lid is desirable in order to provide a uniform thermal resistance of heat transfer pathway away from the integrated circuit and into the lid. Achieving the necessary wetting of indium is not a trivial matter. Furthermore, the aforementioned tilt of the lid may be impacted by thermally-induced movement of the lid adhesive during steps to bond the indium.

Current techniques for establishing metallurgical bonding between a lid, an integrated circuit and the indium thermal interface material sandwiched therebetween involves the use of a flux film applied to both the upper surface of the integrated circuit and the upper surface of the indium thermal interface material. A subsequent reflow process produces a melting followed by a solidification of the indium material which produces the metallurgical bonding. In an ideal process, the flux would be completely displaced during the reflow such that a relatively homogeneous layer of indium remains after reflow. However, conventional indium thermal interface material is applied as a solid sheet or preform. During reflow, the edges of the indium preform can solidify and create a physical barrier that blocks the escape routes for flux remnants. Trapped flux remnants can result in the formation of voids in the indium. Voids in the indium represent areas of higher thermal resistance. Depending on the location of these "hot spots," device performance can be adversely impacted.

One conventional type of package lid has a concave underside that faces toward an indium thermal interface material layer. During reflow, the concavity can produce the aforementioned peripheral solidification and resulting entrapment of flux remnants. Conventional concave lids, as well as planar lids, utilize a gold film to facilitate wetting of indium during reflow. Conventional gold films are typically square and have footprints that generally track the footprints of the underlying die. An issue associated with conventional gold films is the possibility that there will insufficient indium near the corners of the die after reflow. With insufficient indium at the corners, stresses applied to the indium can cause significant cracking of the indium preform after the repeated thermal cycling that occurs during normal device operation. The cracks create areas of heightened thermal resistance and thus hot spots.

Another anomaly sometimes observed in indium thermal interface materials is the appearance of a glob of indium that protrudes laterally from the bulk preform after reflow. Such globs tend to appear randomly. A glob, if large enough and in the right spot, may touch and damage or short external devices, such as capacitors.

The present invention is directed to overcoming or reducing the effects of one or more of the foregoing disadvantages.

SUMMARY OF THE INVENTION

In accordance with one aspect of the present invention, an integrated circuit package device is provided that includes a lid for covering an integrated circuit. The lid has a convex surface for applying pressure on the integrated circuit when the lid is placed in a selected position.

In accordance with another aspect of the present invention, an integrated circuit package device is provided that includes a lid that has a surface for applying pressure to an integrated circuit when the lid is in a selected position. A gold film is coupled to the surface. The gold film has a periphery and a plurality of rounds extending from the periphery.

In accordance with another aspect of the present invention, an integrated circuit package is provided that includes a substrate, an integrated circuit coupled to the substrate and a lid coupled to the substrate over the integrated circuit. The lid has a convex surface for applying pressure on the integrated circuit when the lid is coupled to the substrate.

In accordance with another aspect of the present invention, an integrated circuit package is provided that includes a substrate, an integrated circuit coupled to the substrate and a lid coupled to the substrate over the integrated circuit. The lid has a surface for applying pressure to the integrated circuit when the lid is coupled to the substrate. A gold film is coupled to the surface of the lid. The gold film has a periphery and a plurality of rounds extending from the periphery.

In accordance with another aspect of the present invention, a method of packaging an integrated circuit is provided. An integrated circuit is coupled to a substrate. An indium film is placed proximate the integrated circuit. A lid that has a convex surface is coupled to the substrate. The indium film is reflowed. The convex surface applies pressure to the indium film during the reflow.

In accordance with another aspect of the present invention, a method of packaging an integrated circuit is provided. An integrated circuit is coupled to a substrate. An indium film is placed proximate the integrated circuit. A lid is coupled to the substrate. The lid has a gold film with a plurality of rounds. The indium film is reflowed. The plurality of rounds wets at least a portion of the indium film during the reflow.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
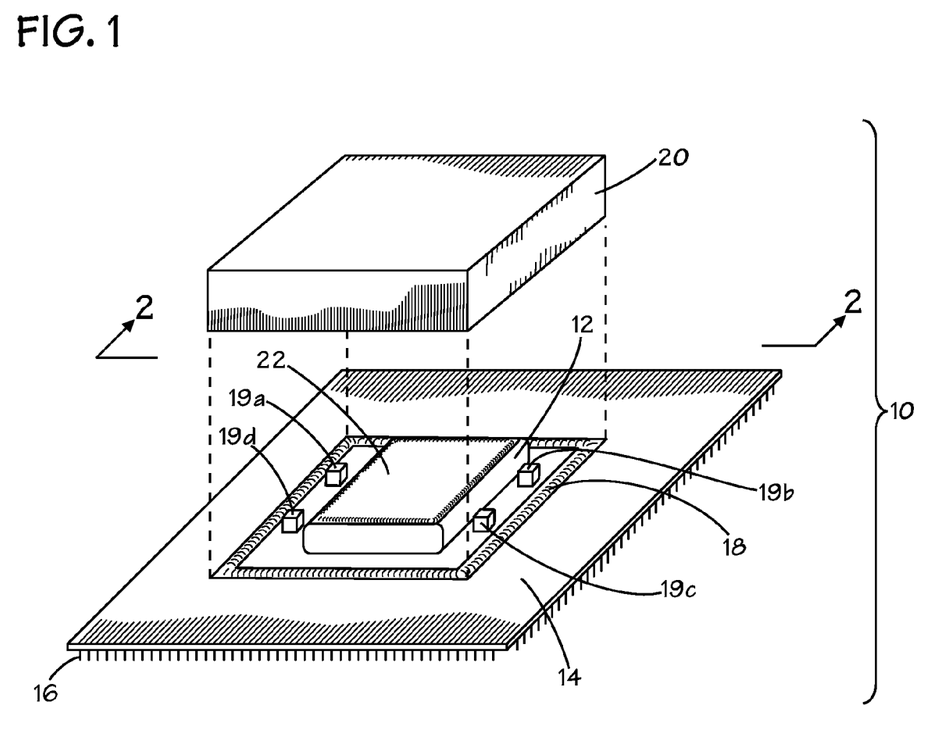
FIG. 1 is an exploded pictorial view of an exemplary embodiment of an integrated circuit package in accordance with the present invention.
Figure 2:
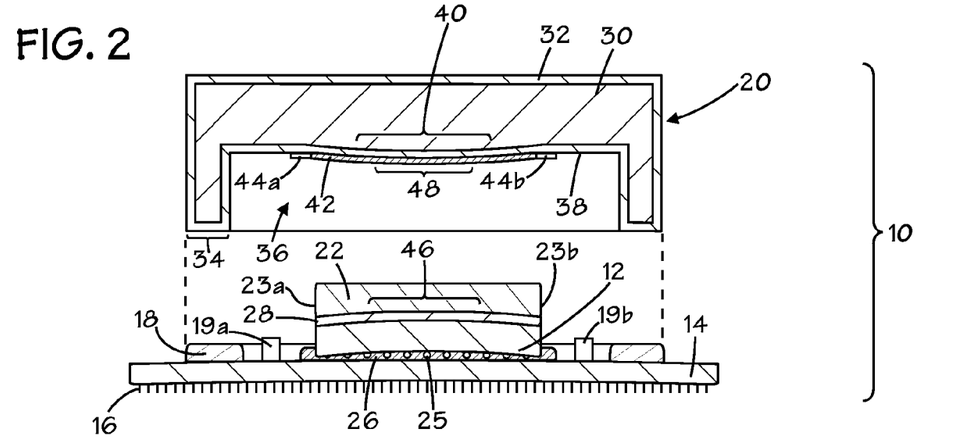
FIG. 2 is a sectional view of FIG. 1 taken at section 2-2 in accordance with the present invention.

In the drawings described below, reference numerals are generally repeated where identical elements appear in more than one figure. Attention is now turned to FIGS. 1 and 2. FIG. 1 is an exploded pictorial view and FIG. 2 is a sectional view of an exemplary embodiment of an integrated circuit package 10 that includes an integrated circuit 12 mounted on a substrate 14. The substrate 14 may be provided with a plurality of conductor pins 16 that form a pin grid array or other pin-type arrangement for providing electrical connection to a socket or other type of electrical connection. Optionally, the substrate 14 may utilize some other form of interconnect, such as, for example, a land grid array or other types of interconnect structures. The integrated circuit 12 is electrically connected to one or more external electronic devices, four of which are visible and labeled 18a, 18b, 18c and 18d. The external devices 18a, 18b, 18c and 18d are typically capacitors, but may also be resistors, inductors or any of a variety of electronic devices used with integrated circuits. The integrated circuit 12 is electrically connected to the external devices 18a, 18b, 18c and 18d via electrical interconnects that are not visible.

An adhesive film 19 is provided on the upper surface of the substrate 14 to secure a lid 20 to the substrate 14. The lid 20 is shown exploded from the substrate 14. To facilitate heat transfer from the integrated circuit 12 to the lid 20, a thermal interface material 22, preferably composed of indium, is disposed on the integrated circuit 12. When the lid 20 is positioned on the substrate 14 and the adhesive film 19 is fully cured as described more fully below, the indium thermal interface material 22 will establish a metallurgical bond with both the integrated circuit 12 and the overlying lid 20. For reasons to be explained later, two channels 23a and 23b are initially provided in the thermal interface material 22. The channels 23a and 23b extend from a peripheral boundary, in this case the edges 23a and 23b, towards the interior of the thermal interface material 22.

Referring now primarily to FIG. 2, the integrated circuit 12 may be secured to the substrate 14 in a great variety of ways. In the embodiment illustrated, the integrated circuit 12 is flip-chip mounted to the substrate 14. A plurality of solder bumps 25 are positioned between the lower surface of the integrated circuit 12 and the upper surface of the substrate 14. The bumps 25 provide electrical interconnects between the integrated circuit 12 and a plurality of electrical conductors (not shown) positioned on the substrate 14 that are interconnected to the conductor pins 16. An underfill layer 26 is provided beneath the integrated circuit 12 to serve principally as a cushion against both physical and thermal expansion loads subjected to the integrated circuit 12.

To facilitate the wetting of the indium thermal interface material 22 to the integrated circuit 12, the upper surface, i.e., the backside, of the integrated circuit 12 is provided with a metallization stack 28 that consists of an aluminum film formed on the integrated circuit 12, a titanium film formed on the aluminum film, a nickel-vanadium film formed on the titanium film and a gold film formed on the nickel-vanadium film. The aluminum film provides advantageous adhesion with silicon. The titanium film provides a barrier layer to prevent gold from migrating into the integrated circuit 12, the nickel-vanadium film provides desirable adhesion between with gold and the gold film provides a desirable wetting surface for indium. The selection appropriate materials for the backside metallization will depend on the composition of the integrated circuit 12 and the thermal interface material 22. The stack 28 is formed on the integrated circuit 12 prior to application of the thermal interface material 22.

The lid 20 is advantageously composed of a material or materials with a relatively favorable conductive heat transfer coefficient. In an exemplary embodiment, the lid 20 consists of a copper core 30 surrounded by a nickel jacket 32. The lid 20 is generally rectangular and may be substantially square if desired. The lid 20 includes a downwardly projecting perimeter wall 34 that defines an interior space 36. The interior space 36 is sized to more than accommodate the footprint of the integrated circuit 12 and the overlying thermal interface material 22. Note that the adhesive film 19 is applied to the upper surface of the substrate 14 with a footprint that generally tracks the footprint of the perimeter wall 34 of the lid 20. To facilitate metallurgical bonding between the thermal interface material 22 composed of indium and the lower surface 38 of the lid 20, a thin film of gold 40 is positioned on the lower surface 38 of the lid 20. The various thicknesses of the thermal interface material 22, the gold film 40 as well as the vertical dimension of the interior space 36 are selected so that when the lid 20 is seated on the adhesive film 19, the thermal interface material 22 and the overlying gold film 40 will be in physical contact.

The lower surface 38 of the lid 20 is provided with a convex region 40. Gold plating 42 is applied to the convex region 40 of the undersurface 38. Unlike conventional gold plating which is substantially square, in footprint, the gold plating 42 is provided with a plurality of shaped rounds, two of which are visible and labeled 44a and 44b in FIG. 2. The structure of the rounds 44a and 44b will be described more fully in conjunction with the discussion of FIG. 3 below. During assembly, a layer of flux (not shown) is applied to the upper surface of the metallization stack 28 prior to the application of the thermal interface material 22 and another layer of flux is applied to the upper surface of the thermal interface material 22 (again not shown). The convex region 40 of the lid 20 results in a concentration of the compressive force or pressure applied to the indium preform 22 at the center 46 of the integrated circuit 12. With the compressive force being concentrated at the center 46 during a subsequent indium reflow process, molten indium will wet the surface of the center 48 of the gold film 42 and thus the lid cavity 36 and the center 46 of the metallization stack 28 and thus the integrated circuit 12 and then spread outwardly to wet the entire upper surface of the metallization stack 28 and the gold film 42. Since the convex region 40 is present, the reflow process will proceed as just described to provide better opportunities for the liberation of any flux or flux residue that might otherwise become trapped during reflow and lead to the formation of voids in the indium preform 22.

The rounds 44a and 44b are designed to provide specifically located wetting surfaces for the indium preform 22 during reflow. The goal is to route molten indium toward the rounds 44a and thus avoid the potential for molten indium to form random bulges which might project downwardly and short the external electronic devices 19a and 19b.

Figure 3:
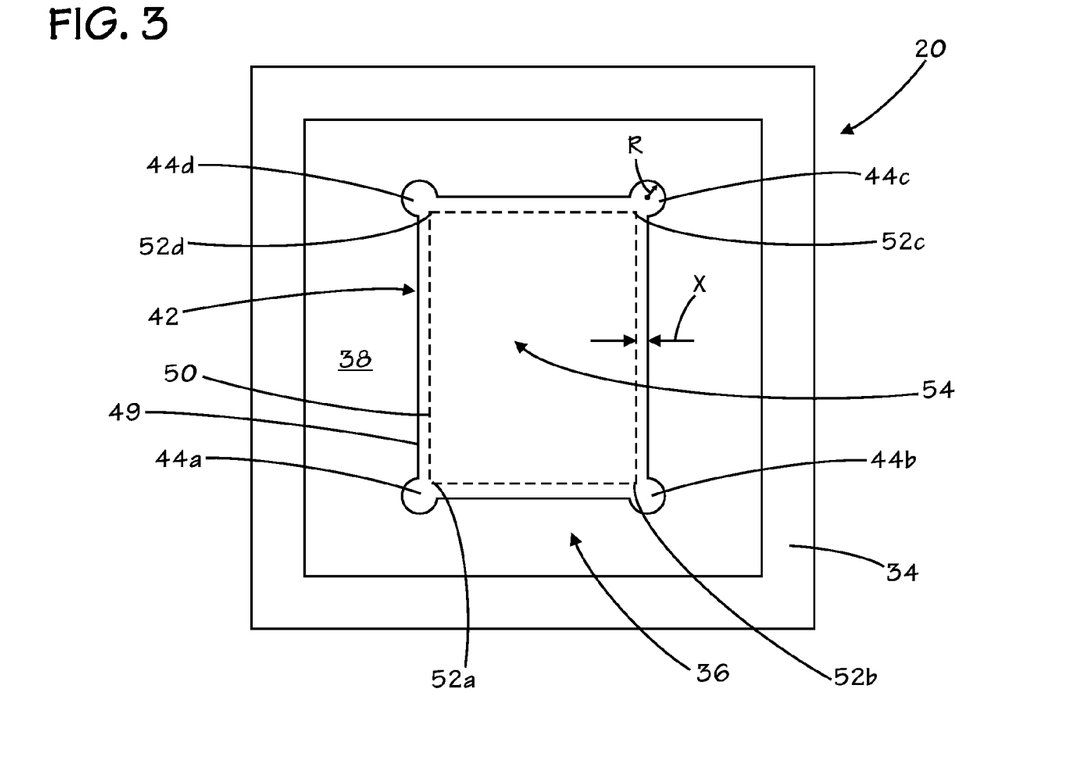
FIG. 3 is a view of the underside of an exemplary embodiment of a package lid in accordance with the present invention.

Additional detail regarding the lid 20 may be understood by referring now also to FIG. 3, which shows the underside of the lid 20 depicted in FIGS. 1 and 2. Since the lid 20 is viewed from the underside, the entirety of the peripheral wall 34 and the internal cavity 36 are visible. As noted above, the gold film 42 is formed on the undersurface 38 of the lid 20. Here, the rounds 44a and 44b, as well as two additional rounds 44c and 44d, of the gold film 42 are visible. The rounds 44a, 44b, 44c and 44d extend laterally away from the periphery 49 of the gold film 42. The dashed box 50 represents the outline or footprint of the integrated circuit 12 over which the gold film 42 will be positioned during assembly. The gold film 42 is provided with an area or footprint that is slightly larger than the footprint 50 of the integrated circuit 12. When the lid 20 is flipped right side up and positioned on the indium preform 22 depicted in FIG. 2, and a reflow process is commenced, the rounds 44a, 44b, 44c and 44d will attract molten indium toward the corners 52a, 52b, 52c and 52d of the integrated circuit. In this way, there will be ample indium located at the corners 52a, 52b, 52c and 52d of the integrated circuit following reflow, which will produce a reduction in the stresses in the indium preform proximate the corners 52a, 52b, 52c and 52d. In addition, since the rounds will strongly attract molten indium toward the corners 52a, 52b, 52c and 52d and thus away from the central portion 54 of the integrated circuit, there will be much less tendency for the production of random globs of indium that might otherwise impact the external circuit devices 18a, 18b, 18c and 18d (see FIG. 1).

In the embodiment illustrated in FIG. 3, the rounds 44a, 44b, 44c and 44d are somewhat circular. However, it should be understood that the exact geometry of the rounds 44a, 44b, 44c and 44d is subject to design discretion. Indeed, the rounds 44a, 44b, 44c and 44d may number less than four and be located at other than the corners. Indeed, the rounds 44a, 44b, 44c and 44d may be located at various locations where it is desirable to attract indium away from the locations of external structures, such as the devices 118a, 118b, 118c and 118d shown in FIG. 1, or where it is important to have bulked up indium, such as at the corners. Similarly, the sizes of the rounds 44a, 44b, 44c and 44d and the overall size of the gold film 42 are again dependant upon the size of the underlying integrated circuit 12 (see FIGS. 1 and 2). In an illustrative embodiment for an integrated circuit with a die size of about 17.7 by 13.26 mm, the gold film 42 may be configured such that there is a gap 56 between the edge of the die area 50 and the edge of the gold film 0.5±0.05 mm and the radius R of the rounds 44a, 44b, 44c and 44d may be about 0.8±0.05 mm.

While well-known gold plating techniques may be used to form the gold film 42, other gold deposition or forming techniques may be used, such as sputtering. The rounds 44a, 44b, 44c and 44d may be formed at the same time as the film 42 using the same techniques or separately using the same techniques.

Figure 4:
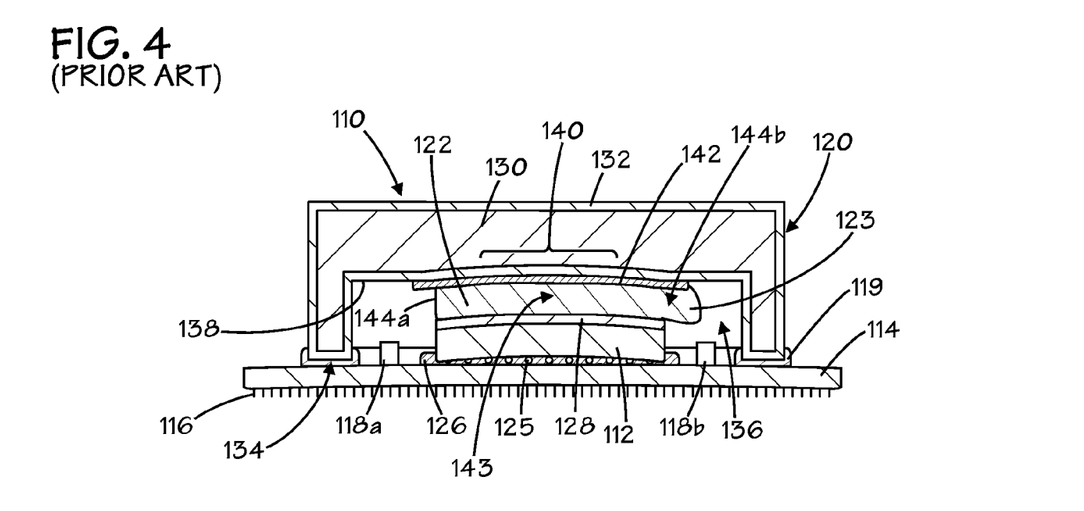
FIG. 4 is a cross-sectional view like FIG. 2 but of a conventional integrated circuit package.

The benefits of the present invention may be better appreciated by briefly contrasting with a conventional package and lid design, such as the example shown in cross-section in FIG. 4. The package 110 encloses an integrated circuit 112 that is mounted on a substrate 114. Two external capacitors 118a and 118b are coupled to the substrate 114. An adhesive 119 couples the conventional lid 120 to the substrate 114. An indium thermal interface material 122 is provided between the lid 120 and the integrated circuit 112. Thermal interface material 122 has an unwanted, and randomly located glob 123 that can jeopardize the external capacitors 118a and 118b as described more fully below. The integrated circuit 112 is flip-chip mounted on solder bumps 125 and an underfill 126. A metallization stack 128 is provided on the integrated circuit 112. The lid 120 includes a core 130 and a jacket 132. A peripheral wall 134 defines the outline of an interior cavity 136 of the lid 120.

The lower surface 138 of the internal cavity 136 includes a concave region 140 upon which a concave-shaped gold film 142 is applied. As a result of the concave design, the indium preform 122 will melt during reflow and seal the periphery, including the edges 144a and 144b, of the indium preform 122 before the indium is wetted to both the gold film 142 and the metallization stack 128.

Figure 5:
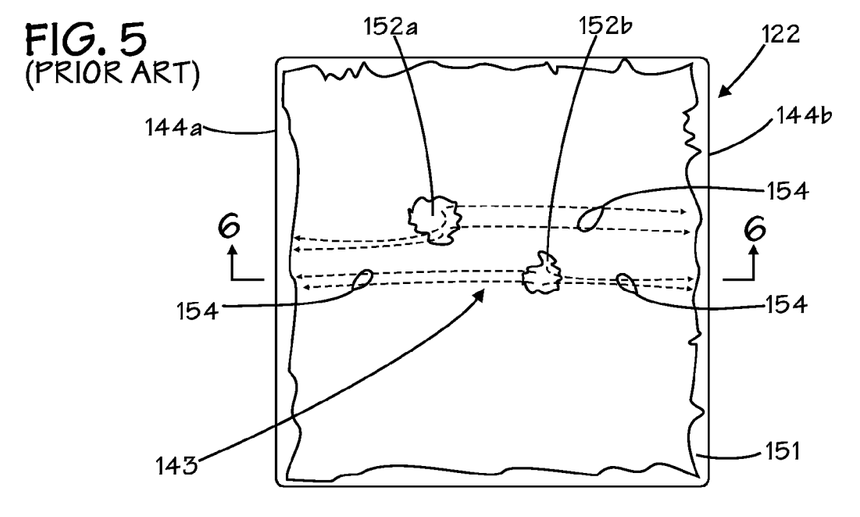
FIG. 5 is a plan view of an indium film undergoing reflow in the conventional package depicted in FIG. 4.
Figure 6:
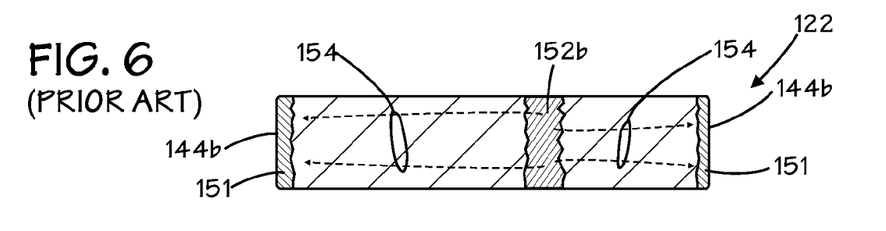
FIG. 6 is a sectional view of FIG. 5 taken at section 6-6.

The effect of the edge solidification is illustrated in FIGS. 5 and 6. FIG. 5 is a plan view of the indium preform 122 shortly after commencement, but before completion, of a reflow process. At this stage a portion of the thermal interface material 122 has undergone solidification to produce a solid barrier 151 that extends around the perimeter of the thermal interface material 122. As noted elsewhere herein, a flux is applied to the interface between the thermal interface material 122 and the underlying integrated circuit (see FIG. 4) as well as on top of the thermal interface material 122 at the interface between the thermal interface material 122 and the overlying lid 120 and gold film 142 (see FIG. 4). The purpose of the flux is to facilitate an ultimate metallurgical bonding between the thermal interface material 122 and the overlying metal and the underlying metal stack 128 of the integrated circuit 112. As noted in the Background section hereof, pockets of the flux may be trapped in the interior 143 of the thermal interface material during the reflow process. Two such exemplary flux remnants 152a and 152b are depicted in FIG. 5, though only the flux remnant 152b is visible in the FIG. 6 sectional view. It is desirable for the flux remnants 152a and 152b to volatilize and liberate as completely as possible from the thermal interface material 122. Otherwise, and as noted in the Background section hereof, the unliberated remnants of flux 152a and 152b can lead to an incomplete reflow of the thermal interface material 122 and the formation of voids in the vicinity of the flux remnants 152a and 152b. Such voids can present regions of extremely poor thermal conductivity between the underlying integrated circuit 112 depicted in FIG. 4 and the overlying lid 120. During the reflow process, the constituents 154 from the flux remnants 152a and 152b are blocked from leaving the thermal interface material 122 by the solidified crust 151 forming at the edges 144a and 144b of the thermal interface material 122. Without an outlet, the flux remnants 152a and 152b will possibly lead to the formation of voids in the thermal interface material 122 and attendant hot spots.

Figure 7:
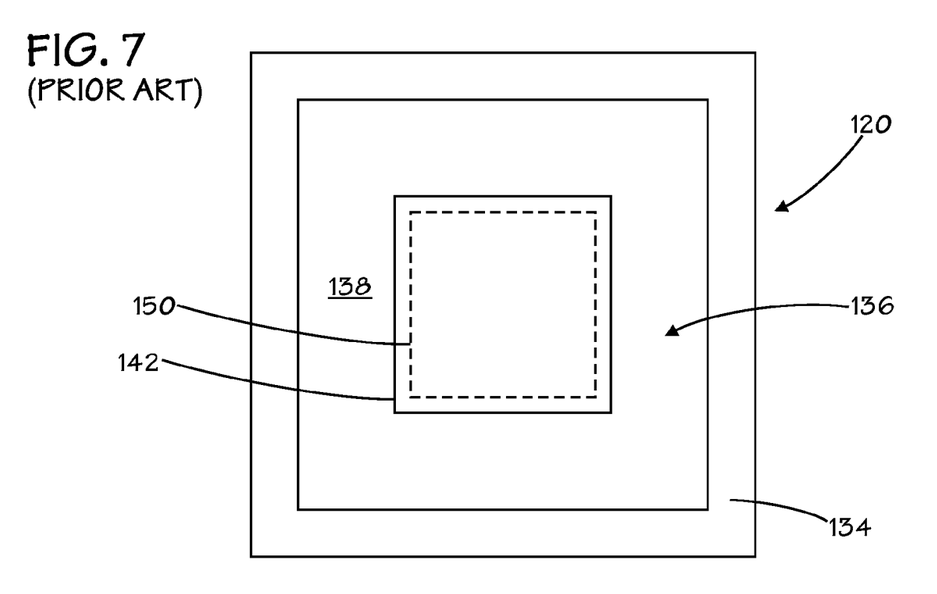
FIG. 7 is a view of the underside of another conventional package lid.
Figure 8:
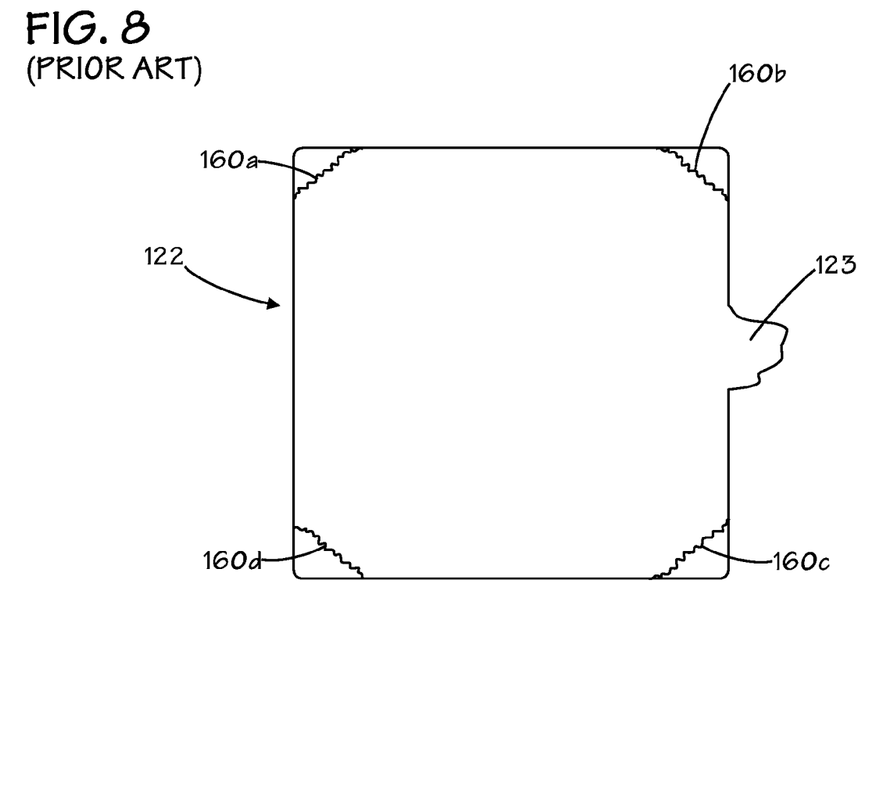
FIG. 8 is a plan view of an indium film used in conjunction with the conventional lid depicted in FIG. 7 following some period of use.

Another mechanical fallout of the conventional lid design may be understood by referring now to FIGS. 7 and 8. FIG. 7 is a view of the underside of the conventional lid 120 depicted in FIG. 4. Again, the entirety of the peripheral surface 134 and the undersurface 138 are both visible. The gold film 142 is substantially rectangular and provided with a footprint that is slightly larger than the footprint 150 of the integrated circuit 112 depicted in FIG. 4. The lack of rounds, such as those in the exemplary embodiment depicted in FIGS. 2 and 3, can result in the somewhat random creation of the glob 123. FIG. 8 depicts a plan view of the thermal interface material 122 following reflow and a plurality of thermal cycles, such as those encountered during normal device operation. Note that the glob 123 projects laterally from the thermal interface material 122, and, as noted above, can jeopardize the electrical integrity of one or more of the external electrical devices 119a and 119b. Furthermore, since the gold film 142 depicted in FIG. 7 does not include rounds which might otherwise attract more indium to the corners of the die footprint 50, there may be insufficient indium in the preform 122 near the corners. As a result, cracks 160a, 160b, 160c and 160d may form in the indium preform 122 following multiple thermal cycles.

An exemplary process flow in accordance with the present invention for attaching the lid 20 to the substrate 14 will now be described in conjunction with FIGS. 1, 2 and 9. Following the mounting of the integrated circuit 12 and the fabrication of the backside metal stack 28, the adhesive film 19 is applied to the substrate 14 in step 260 of FIG. 9. One example of a suitable adhesive 19 is silicone-based thixotropic adhesive, which provides a compliant bond.

At step 265, a film of flux is applied to the integrated circuit 12. The purpose of the flux is to facilitate an ultimate metallurgical bonding between the later-applied indium thermal interface material and the backside metallization stack 28. A rosin-based flux is advantageously used as the flux material. In an exemplary embodiment, the flux may consist of about 20 to 50% by weight rosin mixed with isopropyl alcohol. A jet spray or other suitable application technique may be used to apply the flux.

At step 270, the indium thermal interface material 22 is applied to the integrated circuit 12. This may be done in at least two ways. In this illustrative embodiment, a preformed film of indium with roughly the same footprint as the integrated circuit is applied to the backside metallization 28. An alternative to be discussed below, involves securing the thermal interface material to the lid and then bringing the lid into contact with the integrated circuit 12. The preformed indium thermal interface material 22 may be supplied in a variety of forms. In an exemplary embodiment, preformed pieces of indium may be supplied on a tape that is positioned on a reel. The tape is advanced and individual preformed pieces or sheets of indium are removed from the tape and placed on the integrated circuit 12. The movement of the indium preforms may be by hand, an automated pick and place mechanism or other type of mechanism. The ultimate uniformity in terms of thickness and material distribution of the indium thermal interface material 22 is a function of the degree of tilt of the lid 20 with respect to the substrate 14. It is desirable for the degree of tilt to be as small as possible. The indium thermal interface material 22 will require a reflow process to establish the desired metallurgical bonding with the lid 20 and the integrated circuit 12. It is desired that the reflow process not adversely impact the tilt characteristics of the lid 20. Accordingly, it is preferable to perform a precure process on the adhesive 18. The goal of the precure process is to partially harden the adhesive 19 before the indium thermal interface material 22 undergoes a reflow. In this way, the reflow process will not cause substantial movement either laterally or vertically of the adhesive film and thus the overlying lid 20 during the indium reflow process.

Prior to precure, flux is applied to the indium film 22 at step 275 and the lid 20 is seated on the adhesive film 19 at step 280. A rosin-based flux of the type described elsewhere herein may be used. The seating process may be accomplished by hand with the aid of a guide rack to be described in more detail below or by way of an automated machine. The lid 20 may be preheated prior to seating on the adhesive 19. For example, the lid 20 may be heated to about 100 to 135° C. for 5.0 to 10.0 minutes. The preheated lid 20 is next seated on the adhesive 19. It is anticipated that the temperature of the lid 20 will drop by perhaps 10.0 to 15.0° C. before being seated on the adhesive 19. At the time when the lid 20 is seated on the adhesive 19, the substrate 14 may be positioned in a fixture also to be described in more detail below and a compressive force applied to the lid 20 by way of the fixture. It should be noted that the adhesive 19 may be applied at any point prior to the seating of the lid 20.

With compressive force applied, the substrate 14 and lid combination 20 are subjected to a precure heating at step 285. Suitable temperatures and times for the precure will depend on the adhesive and the thermal interface material. Fast curing adhesives may require as little as about 2.0 minutes at 100° C., however, a precure time of up to an hour will be more typical. The precure process will fix the indium bond line thickness, that is, the thickness of the thermal interface material 22.

Following the precure at step 285, an indium reflow step is performed at step 290. In an exemplary process for indium, the package 10 may be placed in a belt furnace with a nitrogen purge, and heated to about 170 to 190° C. for about 3.0 to 10.0 minutes. The reflow is advantageously performed without compressive force applied to the lid 20. Again, the goal of the indium reflow is to establish metallurgical bonding between the indium thermal interface material 22 and the overlying gold film 40 and the underlying backside metallization stack 28.

Following the indium reflow step 290, the adhesive film 19 undergoes a final curing process at step 300. The curing process is performed without compressive force applied to the lid 20. The final cure may be performed at about 125° C. for about 1.5 hours. Again the temperature and time will depend on the adhesive used.

Figure 9:
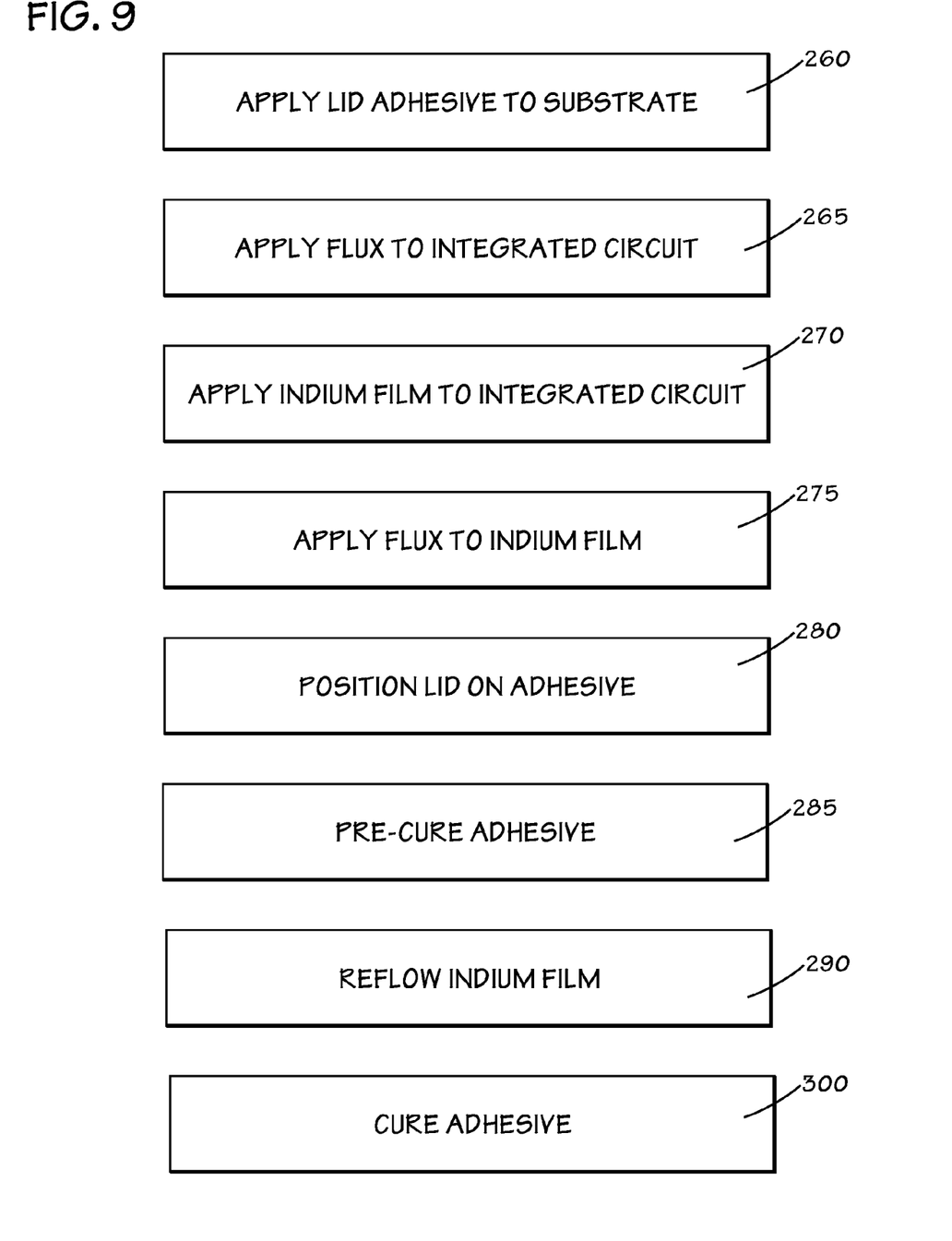
FIG. 9 is a flow chart of exemplary process steps to assemble the integrated circuit package depicted in FIGS. 1 and 2 in accordance with the present invention.
Figure 10:
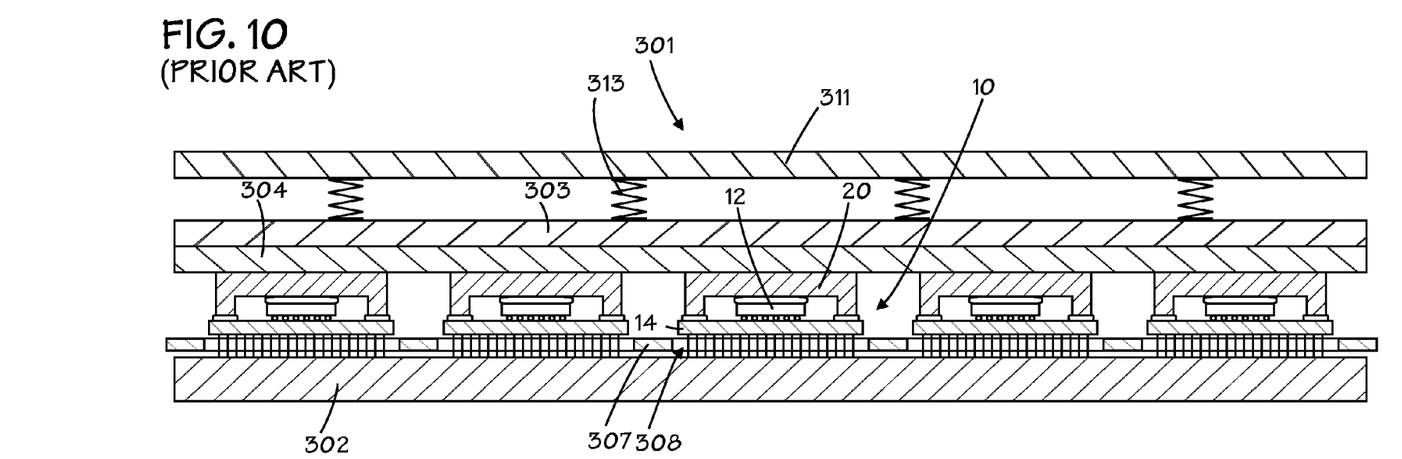
FIG. 10 is a sectional view of an exemplary package fixture to hold the exemplary integrated circuit package of FIG. 1 in accordance with the present invention.

In the process flow described elsewhere herein in conjunction with FIG. 9, it was noted that a fixture may be used to hold an integrated circuit package, such as the package 10 during various process steps. An exemplary embodiment of such a fixture 302 is depicted in FIG. 10, which is a cross-sectional view. A number of integrated circuit packages are depicted, however only one of the packages 10 is provided with element numbering. The description that follows focuses on the package 10, but is illustrative of any packages held by the fixture 301. The fixture 301 includes a base plate 302 upon which the circuit package 10 is seated. A middle plate 303 is designed to seat on top of the circuit package 10. The middle plate 303 is provided with a compliant sheet 304 composed of rubber or other compliant material. The middle plate 303 is brought into secure engagement with the upper surfaces of the circuit package 10 by way of a top plate 305 that includes a plurality of springs 306. Pressure is applied downward on the top plate 305 by an automated machine or manual clamps and results in a downward force transmitted through the middle plate 303 to the circuit package 10.

Figure 11:
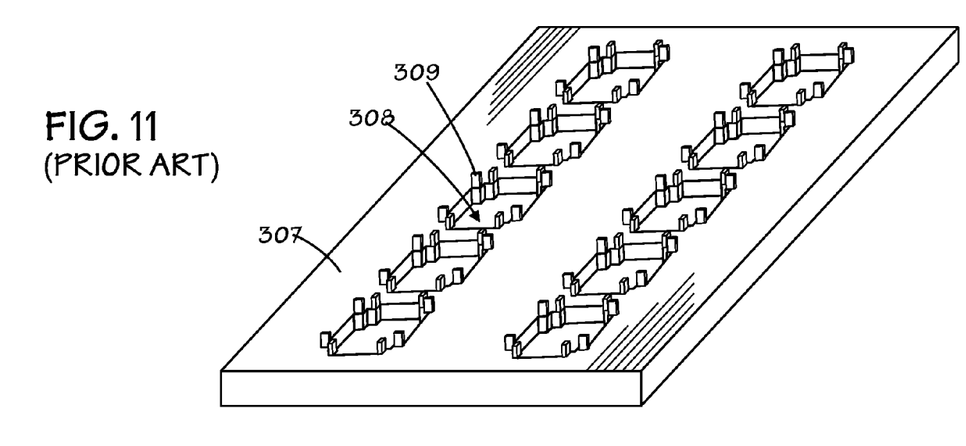
FIG. 11 is a pictorial view of an exemplary integrated circuit package rack to hold the exemplary integrated circuit package of FIG. 1 in accordance with the present invention.

The assembly of the circuit package 10 involves a number of process steps that are routinely carried out in different locations. Accordingly, a rack or boat 307 is utilized to hold the circuit package 10 during movement between various processing areas. As better seen in FIG. 11, which is a pictorial view, the boat 307 includes a plurality of openings 308 and two upwardly-projecting posts 309 at each of the corners of the openings 308. The function of the posts 309 is to engage corners of the substrate 14 of the package 10 and thereby restrain yawing movements of the package 10.

Figure 12:
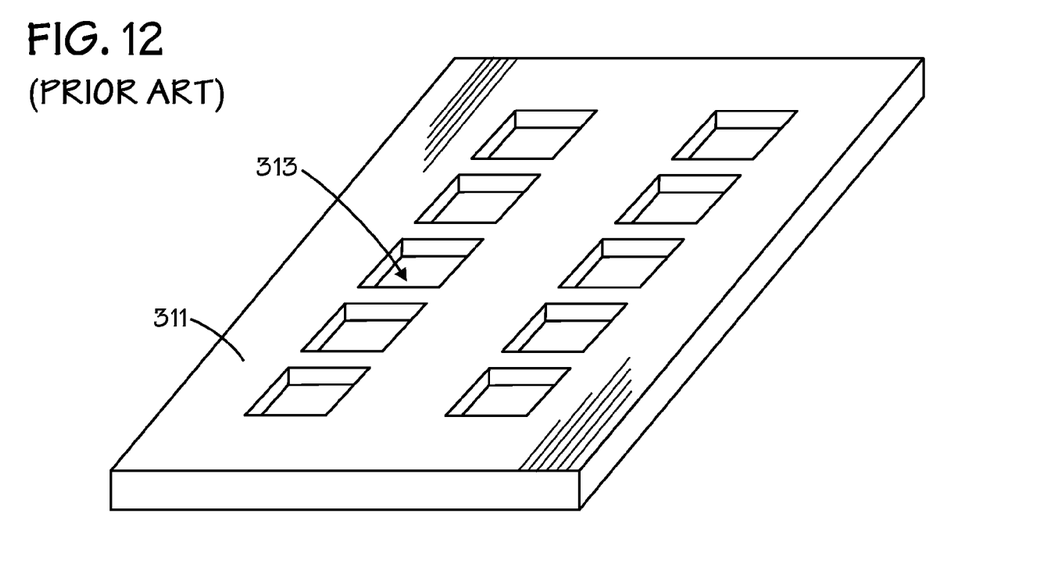
FIG. 12 is a pictorial view of an exemplary integrated circuit package lid plate to aid placement of a lid on the exemplary integrated circuit package of FIG. 1 in accordance with the present invention.

An optional lid alignment plate 311 is depicted in FIG. 12. The alignment plate 311 may be used to facilitate placement of the lid 20 on the substrate 14 of the package. With the lid plate 311 temporarily placed over the package 10 and the base plate 104, the lid 20 is dropped in one of the openings 313 of the lid plate and seated on the substrate 14. The lid plate 311 may be removed prior to positioning of the middle and top plates 106 and 110 depicted in FIG. 10.

It should be understood that movement of the various pieces of the packages 10 as well as various process steps, such as lid preheating, lid placement and lid compression, may be accomplished by automated machine, by hand, or by a combination of the two. For example, a Dai-Ichi Seiko model LAS64 lid attach machine may be used. The LAS64 is capable of high precision lid placement, lid preheating and lid compression. Of course, other types of machines may be used in this regard.

Figure 13:
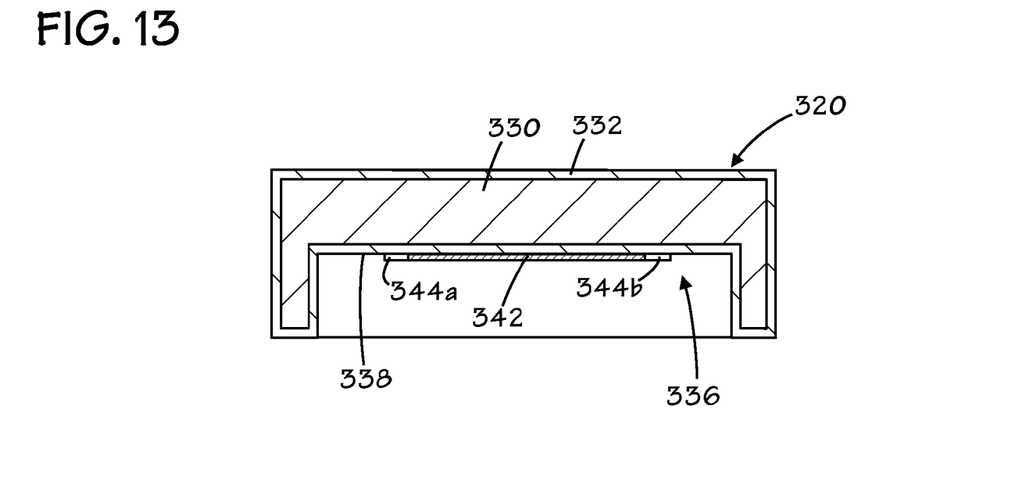
FIG. 13 is a cross-sectional view of an alternate exemplary embodiment of a package lid in accordance with the present invention.

An alternate exemplary embodiment of the integrated circuit package lid 320 may be understood by referring now to FIG. 13, which is a sectional view like FIG. 2. The lid 320 may include a metallic core 330 and jacket 332, an internal cavity 336 and an undersurface 338, like the embodiment of FIGS. 1 and 2. In this illustrative embodiment, a gold film 342 on the undersurface 338 is provided with rounds, two of which are depicted and labeled 344a and 344b. However, the lid 320 does not have a convex region. In this way, the beneficial aspects of the rounds 344a and 344b may be realized without the use of a convex lid.

Figure 14:
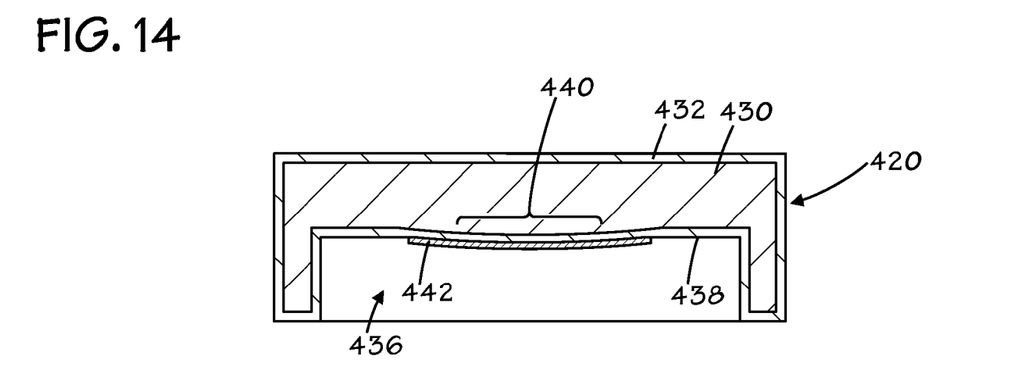
FIG. 14 is a cross-sectional view of another alternate exemplary embodiment of a package lid in accordance with the present invention.

Another alternate exemplary embodiment of the integrated circuit lid 420 may be understood by referring now to FIG. 14, which is a sectional view like FIG. 2. The lid 420 may include a metallic core 430 and jacket 432, an internal cavity 436 and an undersurface 438, like the embodiment of FIGS. 1 and 2. The lid 420 may be provided with a convex region 440 and a gold film 442, but the gold film 442 need not have the shaped rounds of the type depicted in FIGS. 2 and 13.

As noted above in conjunction with FIGS. 1, 2 and 9, the indium thermal interface material 22 may be first applied to the integrated circuit and the lid 20 thereafter seated on the substrate 14. However, another option that may be used that involves the preattachment of an indium thermal interface material to the lid and the subsequent attachment of the lid to the substrate. This alternate embodiment may be understood by referring now to FIG. 15, which is a cross-sectional view like FIG. 2 but of an alternate exemplary embodiment of the integrated circuit package lid 520. An indium preform film or foil 522 is preattached to the lid 520. In other respects, this illustrative embodiment shares many characteristics of the embodiment of the lid 20 depicted in FIG. 2, including a core 530 surrounded by a jacket 532, an internal cavity 536 and an undersurface 438. The lid 520 may be provided with a convex region 540 and a gold film 542, with rounds 544a and 544b or without as desired.

Figure 15:
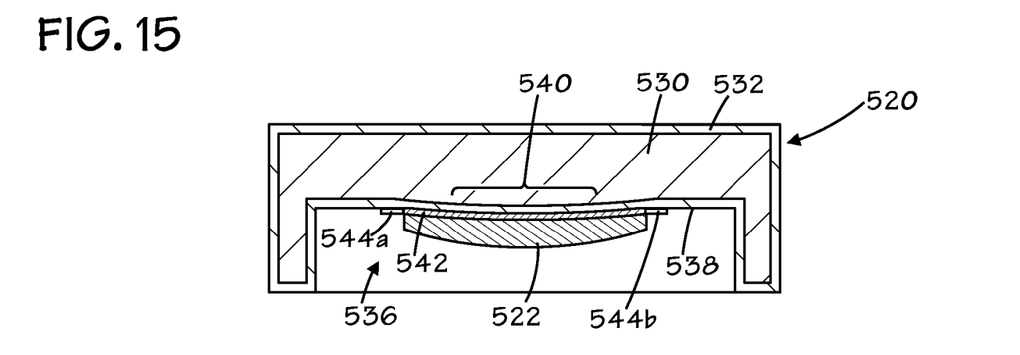
FIG. 15 is a cross-sectional view of another alternate exemplary embodiment of a package lid in accordance with the present invention.

The method of applying the preattached indium thermal interface material 522 is variable. However, in an illustrative embodiment, the preattachment involves applying a flux to the underside 538 of the lid 520, placing an indium piece or foil 522 on the underside 538, performing a reflow heating step, applying a finishing flux to the reflowed indium foil 522, performing another reflow heating step, performing a cleaning step to remove excess flux, performing a stamping or "coining" of the indium foil 522 to achieve a desired thickness of the indium foil 522 and, finally, applying a layer of rosin-based flux to the coined indium foil 522.

The gold film 542 on the underside 538 of the lid 520 is optional. With a preattached indium foil 522, the process flow described elsewhere herein in conjunction with FIG. 9, may be followed to attach the lid 520, albeit without the necessity of performing the step 70 of placing the thermal interface material on the integrated circuit separately.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of packaging an integrated circuit, comprising:
   coupling a first side of an integrated circuit to a substrate, the integrated circuit having a second and opposite side with a metallization stack bonded thereto;
   placing an indium film proximate the metallization stack;
   coupling a lid having a convex surface to the substrate; and
   reflowing the indium film to establish a metallurgical bond with the metallization stack and the convex surface, the convex surface applying pressure to the indium film during the reflow.

2. The method of claim 1, wherein the placing of the indium film comprises placing an indium preform on the metallization stack.

3. The method of claim 1, wherein the coupling of the indium film comprises coupling an indium preform to the lid and placing the lid proximate the metallization stack.

4. The method of claim 1, comprising coupling a gold film to a surface of the lid and between the indium film and the lid.

5. The method of claim 4, comprising providing the gold film with a plurality of rounds.

6. The method of claim 1, wherein the coupling of the lid comprises applying an adhesive between the lid and the substrate.

7. A method of packaging an integrated circuit, comprising:
- coupling an integrated circuit to a substrate;
- placing an indium film proximate the integrated circuit;
- coupling a lid to the substrate, the lid having a gold film with a plurality of rounds; and
- reflowing the indium film, the plurality of rounds wetting at least a portion of the indium film during the reflow.

8. The method of claim 7, wherein the placing of the indium film comprises placing an indium preform on the integrated circuit.

9. The method of claim 7, wherein the coupling of the indium film comprises coupling an indium preform to the lid and placing the lid proximate the integrated circuit.

10. The method of claim 7, wherein the coupling of the lid comprises applying an adhesive between the lid and the substrate.

11. The method of claim 7, wherein the gold film comprises a rectangular film having four corners, each of the four corners including one of the plurality of rounds.

12. A method of manufacturing, comprising:
- providing an integrated circuit package lid having a surface adapted to face towards an integrated circuit; and
- forming a gold film on the surface of the integrated circuit package lid, the gold film having a plurality of rounds adapted to wet molten indium.

13. The method of claim 12, wherein the surface comprises a convex shape.

14. The method of claim 12, wherein the forming the gold film comprises forming a rectangular film having four corners, each of the four corners including one of the plurality of rounds.

15. The method of claim 12, comprising coupling an indium preform to the surface.

16. The method of claim 12, comprising fabricating the integrated circuit package lid with a downwardly projecting peripheral wall defining an interior space.

* * * * *